(12) United States Patent
Seidl et al.

(10) Patent No.: US 6,355,910 B1
(45) Date of Patent: Mar. 12, 2002

(54) HEATING ELEMENT FOR HEATING CRUCIBLES AND ARRANGEMENT OF HEATING ELEMENTS

(75) Inventors: Albrecht Seidl, Freiberg; Stefan Eichler, Dresden; Andreas Köhler, Freiberg, all of (DE)

(73) Assignee: Freiberger Compound Materials GmbH, Freiberg (DE)

( * ) Notice: Subject to any disclaimer, the term of this patent is extended or adjusted under 35 U.S.C. 154(b) by 0 days.

(21) Appl. No.: 09/733,835

(22) Filed: Dec. 8, 2000

(30) Foreign Application Priority Data

Dec. 9, 1999 (DE) .......................................... 199 59 416

(51) Int. Cl.⁷ .............................. H05B 3/10; C30B 35/00
(52) U.S. Cl. ...................... 219/426; 219/422; 117/217
(58) Field of Search ................................. 219/422, 424, 219/426, 539, 541, 552, 553; 373/117, 118, 128, 129, 134; 117/217, 222

(56) References Cited

U.S. PATENT DOCUMENTS

| | | | |
|---|---|---|---|
| 1,928,142 A | * 9/1933 | Trent et al. ................... 338/58 |
| 2,650,254 A | * 8/1953 | Kremers ...................... 373/134 |
| 4,467,185 A | 8/1984 | Moritoki et al. ............ 219/539 |
| 4,503,319 A | * 3/1985 | Moritoki et al. ............ 219/541 |
| 4,533,822 A | 8/1985 | Fujii et al. .................. 219/533 |
| 4,549,345 A | * 10/1985 | Wilsey ......................... 29/611 |
| 4,755,658 A | 7/1988 | Wilsey ........................ 219/541 |
| 5,330,729 A | * 7/1994 | Oda et al. .................... 117/217 |
| 5,660,752 A | 8/1997 | Vilzmann ................... 219/553 |
| 5,766,347 A | 6/1998 | Shimomura et al. ........ 117/217 |
| 5,968,266 A | * 10/1999 | Iino et al. ................... 117/217 |
| 6,093,913 A | * 7/2000 | Schrenker et al. ........... 219/424 |

FOREIGN PATENT DOCUMENTS

| | | |
|---|---|---|
| DE | 4204777 A1 | 2/1992 |
| DE | 4423196 A1 | 7/1994 |
| EP | 0141649 | 10/1984 |
| JP | 59064591 | 4/1984 |
| JP | 60155594 | 8/1985 |

* cited by examiner

*Primary Examiner*—Joseph Pelham
(74) *Attorney, Agent, or Firm*—George W. Neuner, Esq.; Dike, Bronstein, Roberts & Cushman, IP Group of Edward & Angell LLP

(57) ABSTRACT

There is provided a heating element and an arrangement of heating elements, respectively, for heating crucibles, in particular for LEC devices for growing semiconductor single crystals, with a tulip-shaped bottom heater (20) being built such that the heater legs of the main heater (40) positioned thereabove can barely be guided towards the bottom. Such arrangement of bottom and main heater enables multi-heater arrangements without having to interfere with a lateral insulation (18) which, thus, need not be cut out or pierced.

17 Claims, 5 Drawing Sheets

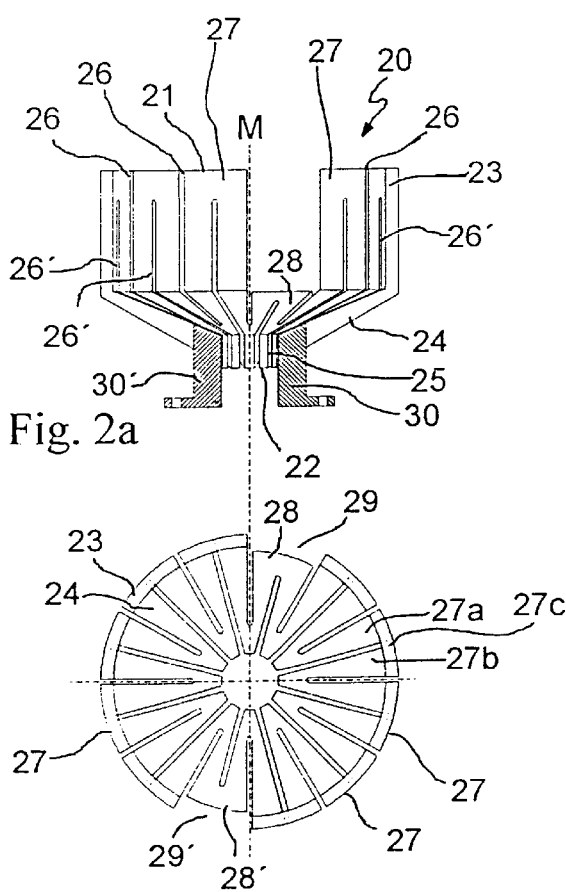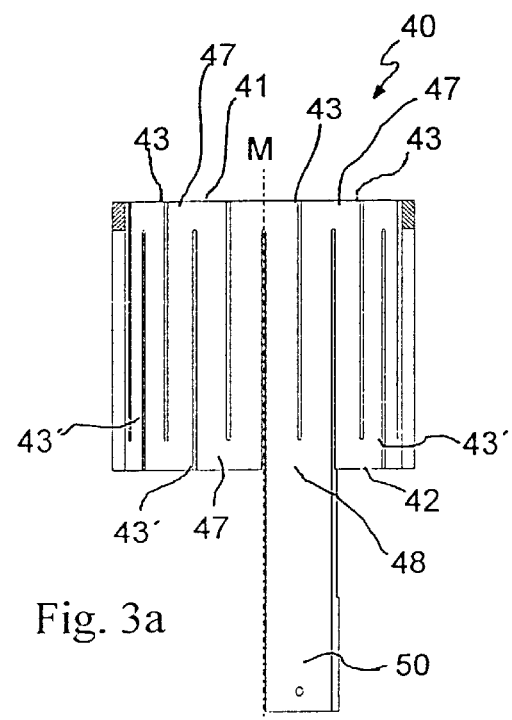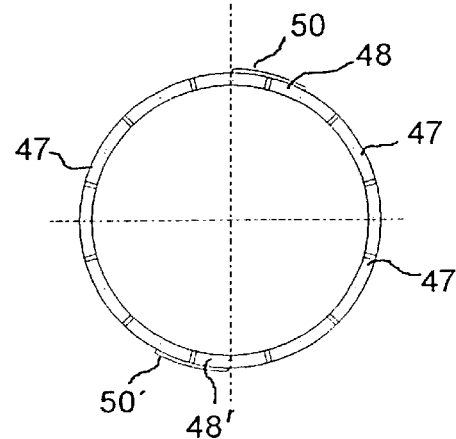

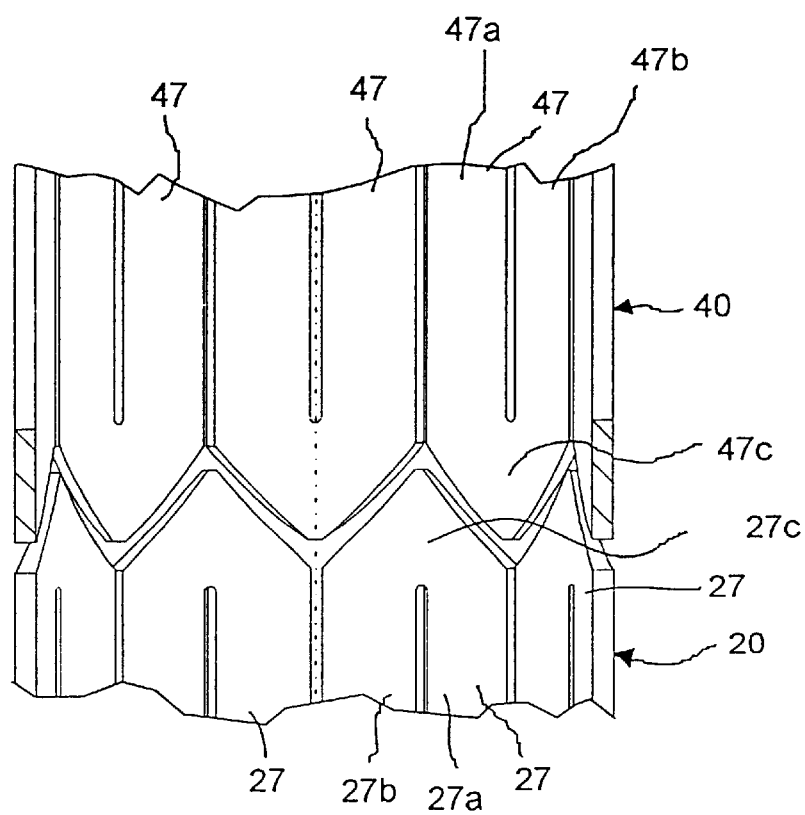
Fig. 5
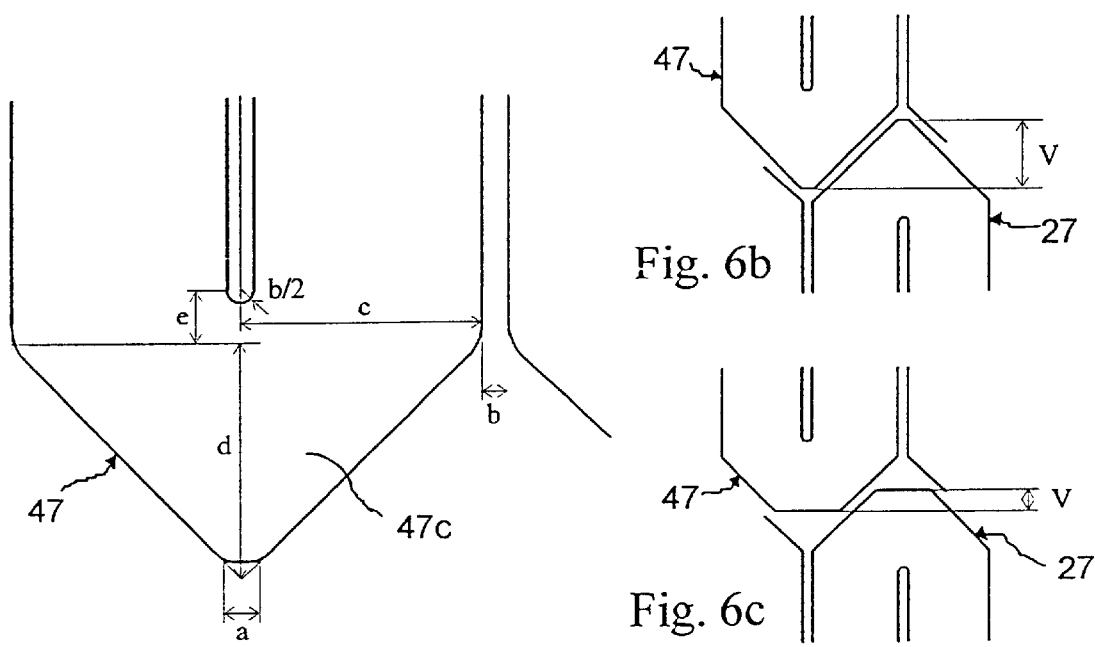
Fig. 6a
Fig. 6b
Fig. 6c

HEATING ELEMENT FOR HEATING CRUCIBLES AND ARRANGEMENT OF HEATING ELEMENTS

BACKGROUND OF THE INVENTION

1. Field of the Invention

The present invention relates to a heating element for heating crucibles as disclosed in claims 1, 7 and 17 as well as to an arrangement of heating elements for heating crucibles as disclosed in claim 13. In particular, these heating elements can be used for heating a crucible when growing semiconductor crystals such as silicon, germanium and gallium arsenide.

2. Prior Art

A known device for growing semiconductor crystals using the Liquid Encapsulated Czochralski (LEC) process is schematically shown in FIG. 7. Such device is known for example from Ishiki, M., Recent Development of Bulk Crystal Growth, Research Signpost 1998, pages 63–64 (ISBN: 81-86481-58-3). A crucible 1 for receiving a molten mass 2 of semiconducting material is arranged on a crucible holder 3 within a cooled recipient 4. The molten semiconductor 2 is covered with a molten mass of boron oxide 12 to prevent volatile components (e.g. As in GaAs melts) from escaping by evaporation. To that end, the steam pressure in the recipient 4 has to be greater than the steam pressure of the volatile component (e.g. >2 bars in the case of GaAs). For heating the crucible 1, there is provided an arrangement of heating elements consisting of a lower heating element 100 surrounding the crucible 1 at its bottom and in a wall region adjacent to the bottom, and an upper heating element 200 provided above the lower heating element 100 and surrounding the upper region of the crucible wall. The lower heating element 100 is connected via power leads 110 to electrodes 120 provided at the bottom of the recipient and the upper heating element 200 is connected via power leads 210 to electrodes 220 which are also provided at the bottom of the recipient. A crystal nucleus 5 is connected to a pulling device 6 fed through the cover of the recipient 4 and arranged above the crucible 1. Also, a growing crystal 7 being pulled from the moltem mass 2 is connected to the pulling device 6 via said crystal nucleus 5. A drive is provided for rotating the crucible holder 3 and the crystal nucleus 5 in opposite directions during the growing process. The arrangement of heating elements 100, 200 is thermally insulated by an annular insulating pipe 8 surrounding the heating elements and consisting of a thermally insulating material. Only a small gap is provided between the insulating pipe 8 and the heating elements 100, 200 in order to prevent excessive gas convection which, due to the high pressure within the recipient, may result in large temperature fluctuations in particular with semiconductor materials having a highly volatile component such as gallium arsenide or indium phosphide.

U.S. Pat. No. 4,533,822 discloses a tulip-shaped heating element used as a bottom heater, which heating element is formed as a jacket-type hollow body having an upper edge and a lower edge, said hollow body comprising a first hollow cylindrical portion having a first cross section and a second portion adjacent thereto and having a tapering cross section, for surrounding a bottom region of a crucible.

DE 44 23 196 A1 discloses a hollow cylindrical heating element 200 for heating crucibles, having an upper edge and a lower edge, and comprising at least one power lead extending from said lower edge as an extension of the cylinder wall of said hollow body.

However, a combination of the known tulip-shaped heating element 100 and the hollow cylindrical heating element 200 in the vertical arrangement shown in FIG. 7 requires an interruption of the tubular thermal insulation with the insulating pipe 8 at least at two openings 9, 10 for feeding through the power leads 210 to the upper heating element 200. Through these openings 9, 10, a cold gas may flow in from the space surrounded by the cooled recipient 4, thus affecting crystal growth.

The vertical arrangement of two heating elements as shown in FIG. 7 enables variable adjustment of the axial temperature gradient within the inner space. However, an abrupt thermal transition at the gap 11 between the lower heating element 100 and the upper heating element 200 causes a disturbance of the axial temperature distribution in this region as well as unfavorable mechanical stresses in the growing single crystal, reducing the yield of single crystal material.

SUMMARY OF THE INVENTION

It is an object of the present invention to provide a heating element and an arrangement of heating elements for heating a crucible, in particular for growing semiconductor single crystals, preventing disturbances in the desired temperature distribution in the region of the molten material and the growing crystal and improving its yield.

This object is achieved by a heating element according to claims 1, 7 or 17 and by an arrangement of heating elements according to claim 13. Further improvements of the invention are presented in the dependent claims.

The invention will be better understood from the following description and figures of preferred embodiments which are presented for illustrative purposes only and are not to be construed as limiting the scope of the present invention.

BRIEF DESCRIPTION OF THE DRAWINGS

FIG. 2a is a cross sectional view of a first embodiment of a heating element according to the invention.

FIG. 2b is a top view of the heating element of FIG. 2a.

FIG. 3a is a cross sectional view of a second embodiment of a heating element according to the invention.

FIG. 3b is a top view of the heating element of FIG. 3a.

FIG. 5 is a part of a section across a further arrangement of heating elements according to the invention.

FIG. 6a is an enlarged cutout illustration of a meander of a further embodiment of a heating element according to the invention.

FIG. 6b is a schematical cutout view of an arrangement of two heating elements according to the invention.

FIG. 6c is a schematical cutout illustration of a further embodiment of the arrangement of two heating elements according to the invention.

DETAILED DESCRIPTION OF PREFERRED EMBODIMENTS

Figure 1:
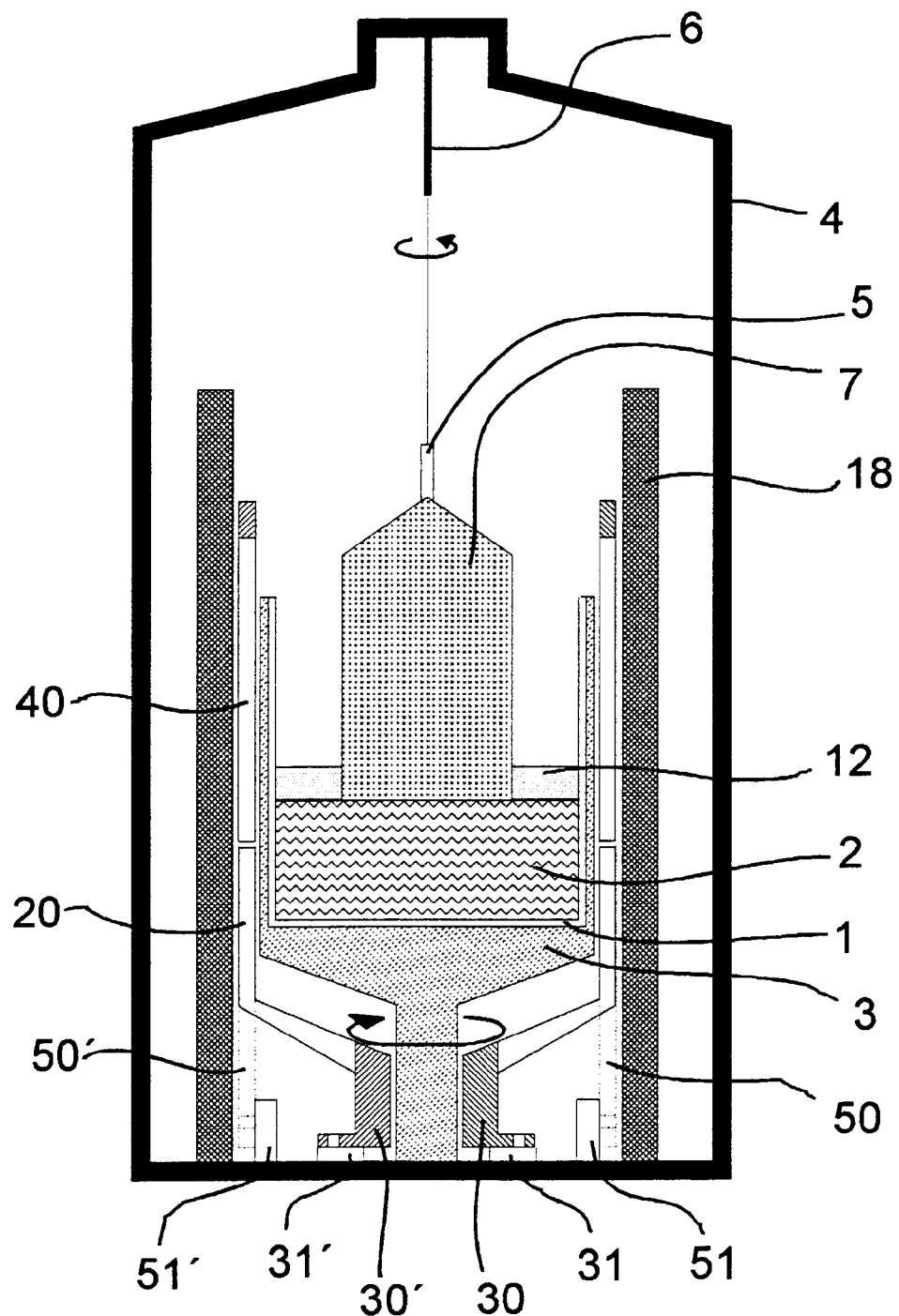
FIG. 1 shows a device according to the invention for growing semiconductor crystals.

A first heating element 20 according to a first embodiment of the invention is shown in FIGS. 2a and 2b and 1. The heating element 20 is formed as a jacket-type hollow body having an upper edge 21 and a lower edge 22. The jacket-type hollow body comprises a first hollow cylindrical portion 23 with its inner diameter dimensioned such that the crucible holder 3 with the crucible 1 can be received in it. Adjacent to the first portion 23, a second portion 24 extends with the cross section of its heating element conically tapering and which ends in an adjacent third portion 25 having a smaller cross section than the first section 23. Thus, the heating element 20 is formed as a tulip-shape. Slits 26 starting from the upper edge 21 and spaced at regular circumferential intervals extend coaxially to the center axis M of the heating element across the first portion 23 and all the way into the second portion 24. Slits 26' in staggered relationship thereto and starting from the lower edge 22 extend coaxially with respect to the center axis M through the third portion 25 and the second portion 24 all the way into the first portion 23. The slits 26, 26' are equally spaced, separating the hollow body into individual meander-shaped segments 27 connected to each other. Each meander-shaped segment 27 is separated into a left-hand side and a right-hand side half portion 27a, 27b of the meander, which half portions are connected to each other by a meander turning bend 27c. In the region of the lower edge 22, two power leads 30, 30' are provided through which the heating element 20 is connected to electrodes 31, 31' provided at the recipient bottom. Two meander-shaped segments 28, 28' diametrically opposite to each other are shortened in such a manner that they extend only from the third portion 25 all the way to the border line between the second portion 24 and the first portion 23. Thus, two cutouts 29 and 29' or gaps opposite to each other and having a width equal to a meander-shaped segment are formed in the hollow cylindrical portion 23, in which cutouts or gaps power leads for a second heating element described below are arranged.

FIGS. 3a and 3b show a second heating element according to a first embodiment. The heating element 40 is formed as a cylindrical hollow body having an upper edge 41 and a lower edge 42. The cross section of the heating element 40 corresponds to the cross section of the hollow cylindrical first portion 23 of the first heating element 20. At equal intervals, in alternating relationship and starting from the upper edge 41 and the lower edge 42, respectively, coaxially arranged slits 43 and 43', respectively, extend all the way to a predefined distance from the lower edge 41 and the upper edge 42, respectively. The slits 43, 43' separate the hollow body into meander-shaped segments 47. At two locations circumferentially and diametrically opposite to each other, each of a pair of meander-shaped segments 48, 48' is connected to a power lead 50, 50' having a width corresponding to the width of the meander-shaped segment 48, 48' and extending from the lower edge 42 as an extension of the meander-shaped segment 48, 48' along a length such that, when arranged in the crystal growing installation, the heating element 40 with the power leads 50, 50' engages the gaps 29, 29' of the heating element 20 and can be connected to the electrodes 51, 51' of an electrical power source, arranged at the recipient bottom. Preferably, the power lead 50, 50' is formed as an extension of the meander-shaped segment 48, 48'.

Both the heating element 20 and the heating element 40 are preferably made from graphite.

Figures 4A, 4B:
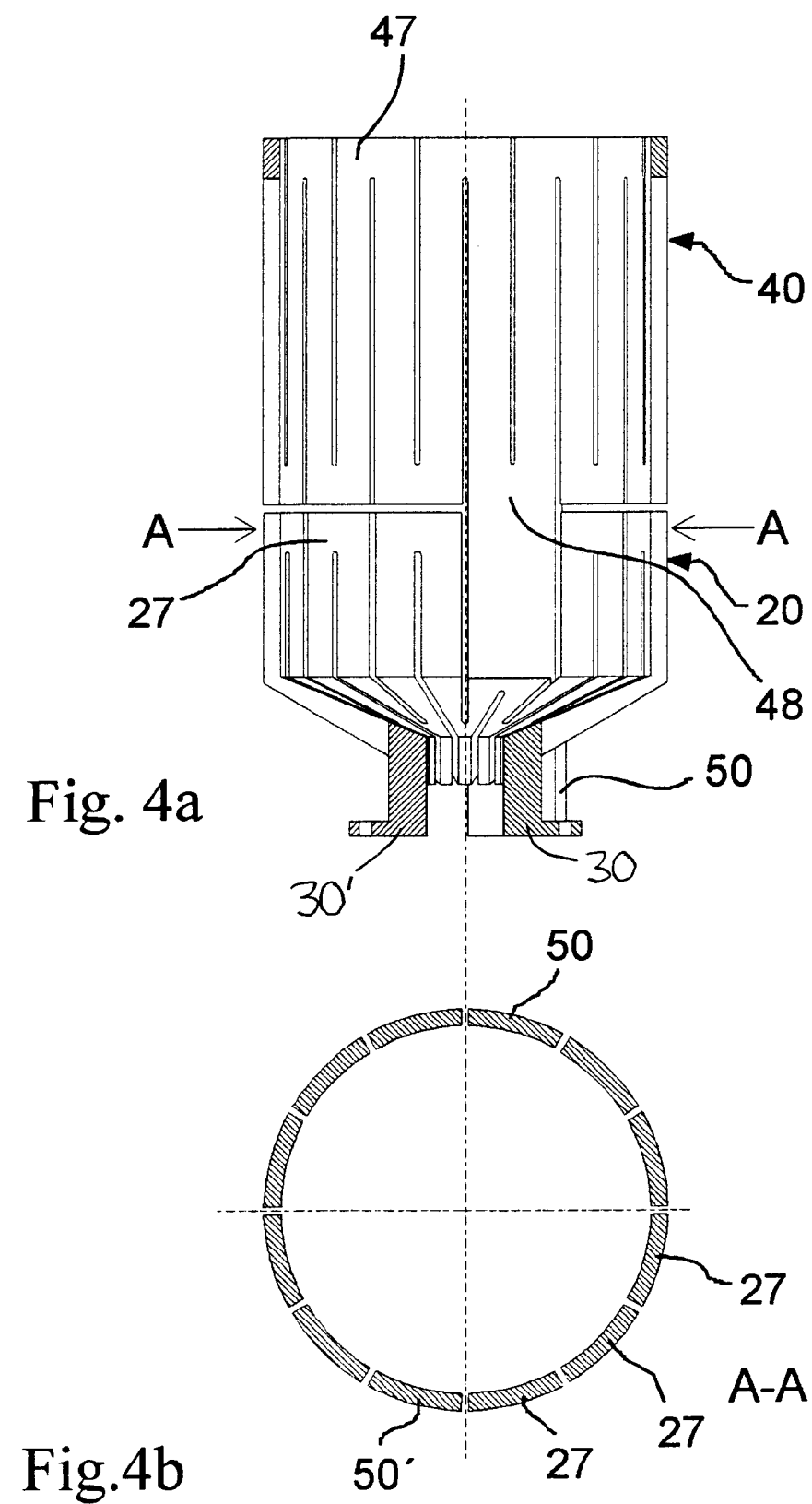
FIG. 4a is a cross sectional view of the arrangement of heating elements according to the invention.
FIG. 4b is a section along A—A of FIG. 4a across the arrangement of heating elements according to the invention.

Referring to FIGS. 4a and 4b, the arrangement of heating elements according to the invention consists of a combination of the first heating element 20 and the second heating element 40. In operation, heating element 40 is arranged above heating element 20 such that the power leads 50, 50' of the second heating element 40 almost exactly engage the cutouts 29, 29' of the first heating element 20. The length of the power leads of the second heating element has been chosen such that, when arranged on top of each other, both heating elements may be connected to the electrodes 51, 51' of an electrical power source, with each of the electrodes being provided at the recipient bottom. The power leads 50, 50' have a width, thickness and resistivity dimensioned such that during operation, their heating power roughly corresponds to the heating power of an adjacent meander-shaped segment 27 of the first heating element 20.

Referring to a further embodiment of the heating elements illustrated in FIGS. 5 and 6a through 6c, the upper edge 21 of the first, lower heating element 20 and the lower edge 42 of the upper, second heating element 40 are serrated. Each meander turning bend 27c and 47c, respectively, is formed as a triangle and the meander-shaped segments 27 of the lower heating element 20 are arranged with respect to the meander-shaped segments 47 of the upper heating element 40 in a position turned by an azimutal angle corresponding to a meander-shaped segment, such that the heating elements 20 and 40, when arranged on top of each other, are in serrated or meshing engagement.

The geometrical parameters determining the depth of serration V of a triangular serration are illustrated in FIGS. 6a through 6c, where a represents a truncation of the triangle tip; b is the meander spacing, i.e. the width of the above slits 26, 26' and 43, 43', respectively; c corresponds to the width of one half 27a, 27b, 47a, 47b of a meander-shaped segment and half the triangle base, respectively; e is the distance between the meander turning point and the triangle base; and d is the height of the shape-determining triangle. In the case where the smallest distance of the heaters 20, 40 among each other equals the meander spacing b and the shape-determining geometry is a triangle, the depth of serration V is given by $$V = d - (b/c) \cdot \sqrt{c^2 - d^2} - ad/2c$$

Preferably, $$c = e + d$$

in order to guarantee that power dissipation throughout the heating region is as homogeneous as possible.

All the edges that are created are rounded to reduce breakability.

The form of the serrated edges according to the invention is not limited to the heating elements 20 and 40 with the power lead of the upper heating element 40 engaging a gap of the lower heating element 20. Even regular heating elements where a power lead for the upper heater is passed through the insulating pipe, may be formed with such serration. Also, the serration may be provided at the upper and at the lower edge of each heating element.

Figure 7:
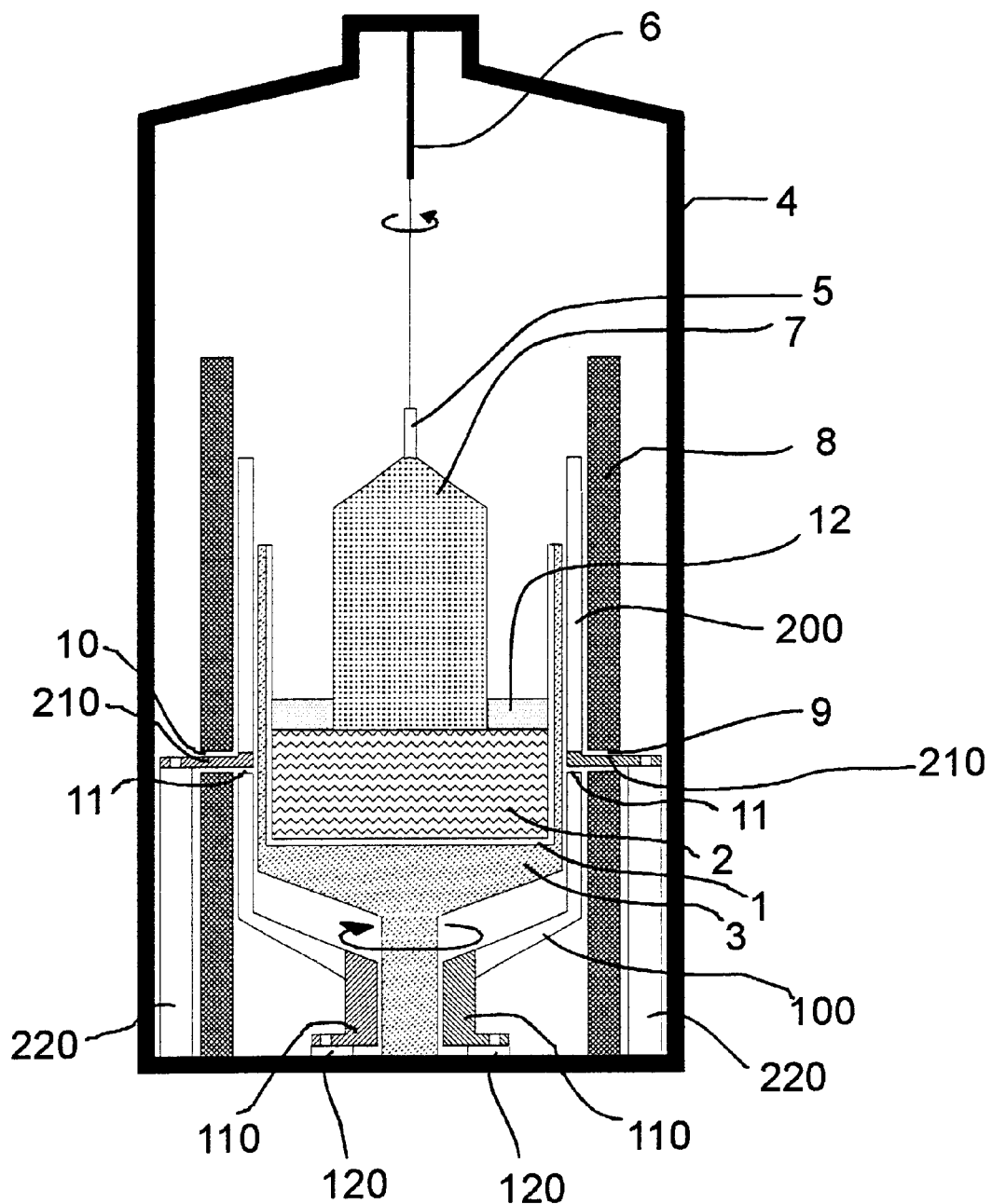
FIG. 7 is a schematical illustration of a known device for growing semiconductor crystals.

The arrangement of the heating elements 20 and 40 according to the invention for growing a semiconductor single-crystal using the LEC method is shown in FIG. 1. The apparatus corresponds to the one described with regard to FIG. 7, and identical elements are given the same reference numerals and their description will not be repeated. Unlike the apparatus according to FIG. 7, the apparatus according to FIG. 1 comprises the tulip-shaped first heating element 20 as a bottom heater having its power leads 30, 30' connected to electrodes 31, 31' arranged at the bottom of the recipient. Above the first heating element 20, the second heating element 40 coaxially aligned thereto is arranged and engages the cutouts 29, 29' of the lower heating element 20. The power leads 50, 50' are connected to electrodes 51, 51' provided at the bottom of recipient 4. Thus, it is not necessary to provide openings in the insulation pipe 18 for feeding the power leads to the second heating element 40, and the insulation pipe 18 is formed with a closed wall. Since no parts protrude towards the outside from the second heating element 40, the insulation pipe 18 may be arranged with a minimum distance to the heating element. As a result, heat losses are minimized and parasitic gas convection as well as temperature variations associated to it in the region of the crucible 1 can almost be ruled out.

The apparatus according to FIG. 1 further comprises a control for independently controlling the heating elements 20, 40. The control is formed such that the heating power of the above heating element in the region of the power leads 50, 50' corresponds to the heating power of an adjacent meander-shaped segment 27 of the heating element 20 located thereunder.

During the operation of the apparatus according to FIG. 1, a molten mass 2 of the semiconductor material is first produced in the crucible, using the heating elements 20, 40. The crystal nucleus 5 is submerged into the molten mass 2 and the the formation of the single crystal starts on it. During the process, the crystal nucleus 5 is rotated by the pulling device 6 while the crucible holder 3 together with the crucible 1 and the molten mass 2 contained in it are rotated in the opposite direction of the crystal nucleus. At the beginning of the single-crystal growth the crystal nucleus submerged into the molten mass is kept as cold as possible to prevent volatile components from evaporating and destroying the nucleus, while at a later stage of the growth the crystal piece which has already been grown is kept as warm as possible to minimize thermal stresses. The temperatures required therefor are adjusted primarily by the upper region of the heating element arrangement, i.e. by the heating element 40. In the region of the molten mass, the temperature is kept very stable using the lower portion of the heating element arrangement, i.e. by adjusting the heating element 20. Then, the slowly growing crystal 7 is being pulled out in the known fashion using the pulling device 6. As the region of the power leads 50, 50' of the upper heater 40 also acts as a heating region in the lower heater 20, a uniform azimutal temperature distribution will be maintained by appropriate dimensioning. In the vertical direction at the transition between the two heating elements 20 and 40, the mutual serration of the two heating elements enables a continuous thermal junction/transition. Due to the meshingly engaging meander-shaped segments, a local azimutal heat exchange is achieved, thus transforming the axial inhomogeneities of the temperature field in the conventional arrangement into azimutal inhomogeneities according to the invention. These, however, are largely balanced by the crucible rotation.

The invention has the advantage that the assembly of the heaters is simple and safe, that heaters with a smallest possible maximum diameter and space-saving lateral insulation pipes may be used, thus making good use of the available space, and that minimal convection spaces exist in the heating region. Especially with very large oven arrangements suitable for receiving crucibles which are 28 cm and above in diameter, the invention results in reduced material costs with regard to the graphite parts for the heating elements as well as more safety during the process.

We claim:

1. A heating element for heating crucibles, which heating element is formed as a jacket-type hollow body having an upper edge and a lower edge, said hollow body comprising a first hollow cylindrical portion having a first cross section and a second portion adjacent thereto and having a tapering cross section, for surrounding a bottom region of a crucible, wherein at least one cutout extending from said upper edge to the beginning of said second portion is provided in said first portion, which cutout is dimensioned such that a power lead for an adjacent second heating element can be fed therein.

2. The heating element as claimed in claim 1, wherein said hollow body comprises slots extending in an alternating fashion from its upper edge and its lower edge, respectively, and forming meander-shaped segments, and wherein said cutout in said first portion is formed by a meander-shaped segment shortened in correspondence with the size of said cutout.

3. The heating element as claimed in claim 1, wherein said hollow body is tulip-shaped.

4. The heating element as claimed in any one of claims 1 through 3, wherein at least two cutouts are provided.

5. The heating element as claimed in claim 4, wherein two cutouts opposite to each other are provided.

6. The heating element as claimed in claim 2, wherein meander turning bends of said meander-shaped segments are formed as truncated triangles.

7. A heating element for heating crucibles, which heating element is formed as a cylindrical hollow body having a cylinder wall, an upper edge and a lower edge, and comprising at least one power lead extending from said lower edge as an extension of the cylinder wall of said hollow body, wherein said power lead is formed such that it fills up a cutout of said heating as claimed in claim 1.

8. The heating element as claimed in claim 7, wherein said hollow body comprises slots extending in an alternating fashion from its upper edge and its lower edge, respectively, with said slots forming meander-shaped segments and said power lead being formed as an extension of a meander-shaped segment beyond said lower edge.

9. The heating element as claimed in claim 8, further comprising a second heating element, which second heating element is formed as a jacket-type hollow body having an upper edge and a lower edge, said hollow body comprising a first hollow cylindrical portion having a first cross section and a second portion adjacent thereto and having a tapering cross section, for surrounding a bottom region of a crucible, wherein at least one cutout extending from said upper edge to the beginning of said second portion is provided in said first portion, which cutout is dimensioned such that a power lead for an adjacent second heating element can be fed therein, wherein said power lead is formed such that, when in its operating state, it provides heating power corresponding to the heating power of the portions of a second heating element, surrounding said cutout.

10. The heating element as claimed in claim 8, wherein the meander turning bends of said meander-shaped segments are formed as truncated triangles.

11. The heating element as claimed in any one of claims 7 through 10, wherein at least two power leads are provided.

12. The heating element as claimed in claim 11, wherein two power leads opposite to each other are provided.

13. An arrangement of heating elements for heating a crucible, having a first heating element surrounding the bottom of a crucible and a wall region of the crucible adjacent to the bottom, and having a second heating element surrounding the wall of said crucible in adjacent relationship with said first heating element, wherein a power lead of said second heating element is guided in a cutout of the wall of said first heating element, wherein said first heating element is formed as a jacket-type hollow body having an upper edge and a lower edge, said hollow body comprising a first hollow cylindrical portion having a first cross section and a second portion adjacent thereto and having a tapering cross section, for surrounding a bottom region of a crucible, wherein at least one cutout extending from said upper edge to the beginning of said second portion is provided in said first portion, which cutout is dimensioned such that a power lead for an adjacent second heating element can be fed therein.

14. The arrangement of heating elements as claimed in claim 13, wherein said second heating element is formed as a cylindrical hollow body having a cylinder wall, an upper edge and a lower edge, and comprising at least one power lead extending from said lower edge as an extension of the cylinder wall of said hollow body.

15. The arrangement of heating elements as claimed in any one of claims 13 through 14, wherein said first and second heating elements are each formed as a hollow body divided into meander-shaped segments by slots alternately starting from the upper edge and the lower edge, respectively, of said hollow body, with mutually facing meander turning bends of the upper heating element and the lower heating element, respectively, being formed as truncated triangles and with said heating elements being in mutual arrangement such that said meander turning bends meshingly engage each other.

16. A heating element for heating a crucible, formed by a jacket-type hollow body having an upper and a lower edge and comprising a hollow cylindrical portion, said hollow body being divided into meander-shaped segments by slots alternately starting from the upper edge and the lower edge, respectively, of said hollow body, wherein said meander turning bends at an edge adjacent to said hollow cylindrical portion are formed as truncated triangles.

17. The heating element as claimed in claim 1, wherein said heating element is made of graphite.

* * * * *